United States Patent
Schmid et al.

(10) Patent No.: US 8,098,077 B2
(45) Date of Patent: Jan. 17, 2012

(54) CONTACT-MAKING APPARATUS

(75) Inventors: Rainer Schmid, Pliezhausen (DE); Achim Weiland, Hildrizhausen (DE)

(73) Assignee: Feinmetall GmbH (DE)

( * ) Notice: Subject to any disclaimer, the term of this patent is extended or adjusted under 35 U.S.C. 154(b) by 208 days.

(21) Appl. No.: 11/473,726

(22) Filed: Jun. 23, 2006

(65) Prior Publication Data
US 2007/0017702 A1   Jan. 25, 2007

(30) Foreign Application Priority Data

Jun. 23, 2005 (DE) .......................... 10 2005 029 105
Apr. 15, 2006 (DE) .......................... 10 2006 017 758

(51) Int. Cl.
*G01R 31/20* (2006.01)

(52) U.S. Cl. ................................. 324/754.11; 324/149

(58) Field of Classification Search .................. 324/761, 324/754.11, 149
See application file for complete search history.

(56) References Cited

U.S. PATENT DOCUMENTS

| | | | |
|---|---|---|---|
| 3,044,151 A | 7/1962 | Coler | 29/155.55 |
| 4,069,370 A | 1/1978 | Harmsen et al. | 428/671 |
| 4,183,609 A | 1/1980 | Luna | |
| 4,294,726 A | 10/1981 | Bozon et al. | 252/462 |
| 4,820,170 A | 4/1989 | Redmond et al. | 439/66 |
| 4,897,043 A | 1/1990 | Giringer et al. | 439/482 |
| 5,097,100 A | 3/1992 | Jackson | 174/94 |
| 5,266,895 A | 11/1993 | Yamashita | |
| 5,378,971 A | 1/1995 | Yamashita | |
| 5,952,843 A | 9/1999 | Vinh | 324/761 |
| 6,297,657 B1 | 10/2001 | Thiessen et al. | 324/761 |
| 6,300,783 B1 * | 10/2001 | Okubo et al. | 324/761 |
| 7,091,734 B2 | 8/2006 | Kazama | 324/761 |
| 7,285,973 B1 * | 10/2007 | Mardi et al. | 324/765 |
| 2002/0019152 A1 * | 2/2002 | Eldridge et al. | 439/66 |
| 2004/0080329 A1 | 4/2004 | Jain | 324/765 |
| 2004/0239357 A1 * | 12/2004 | Tashiro et al. | 324/761 |
| 2004/0239578 A1 | 12/2004 | Aisenbrey | 343/872 |
| 2005/0140382 A1 * | 6/2005 | Wilson et al. | 324/754 |
| 2005/0200375 A1 * | 9/2005 | Sudin | 324/761 |

FOREIGN PATENT DOCUMENTS

CN   86 1 08030   6/1987

(Continued)

OTHER PUBLICATIONS

Hong et al., Microstructural Stability and Mechanical Response of Cu-Ag Microcomposite Wires, Mar. 18, 1998, Acta mater. vol. 46, No. 12, pp. 4111-4122.*

(Continued)

*Primary Examiner* — Ha Tran T Nguyen
*Assistant Examiner* — Shaun Campbell
(74) *Attorney, Agent, or Firm* — Ostrolenk Faber LLP

(57) ABSTRACT

A contact-making apparatus for electrical connection of a unit under test to an electrical test device. The apparatus has a plurality of electrical test contacts, which are associated with at least one holding element, for making contact with the unit under test. An adapter device increases the distance between adjacent contact paths. The adapter device has contact elements for touch contact with the test contacts. The contact elements are comprised of noble metal or of a noble metal alloy, or of an alloy having at least one noble metal component, or of electrically conductive plastic. The invention also relates to a corresponding method of forming the contact elements by heating and then cooling and then forming the apparatus.

22 Claims, 2 Drawing Sheets

FOREIGN PATENT DOCUMENTS

| | | |
|---|---|---|
| DE | 29 04 360 A1 | 8/1980 |
| DE | 37 02 184 | 7/1987 |
| DE | 37 15 171 A1 | 11/1987 |
| DE | 197 48 825 A1 | 5/1999 |
| DE | 697 27 941 | 1/2005 |
| EP | 0 790 502 A2 | 8/1997 |
| JP | 5-041425 | 6/1993 |
| JP | 6-066834 | 3/1994 |
| JP | 10-104270 | 4/1998 |
| JP | 2000-162238 | 6/2000 |
| JP | 2001-289874 | 10/2001 |
| JP | 2002-071714 | 3/2002 |
| JP | 2004-09355 | 3/2004 |
| TW | 567317 | 12/2006 |
| WO | WO 99/49329 | 9/1999 |

OTHER PUBLICATIONS

Translation of Chinese Office Action in 200610095916.5 dated Jan. 2, 2008.
European Search Report. 10 pages.
European Search Report. 3 pages.
English translation of Taiwanese Office Action dated Feb. 20, 2008 in Taiwan Application No. 95120448.
English translation of an Office Action issued in related Japanese Patent Application No. 2006-171027, received Mar. 23, 2009.
European Office Action mailed Apr. 26, 2010 in related European Application No. 06 011 045.9.-1231 with English translation of relevant portions thereof.

* cited by examiner

CONTACT-MAKING APPARATUS

BACKGROUND OF THE INVENTION

The invention relates to a contact-making apparatus for electrical connection of a unit under test to an electrical test device. The contact making apparatus has a plurality of electrical test contacts, which are associated with at least one holding element, for making contact with the unit under test. The contact making apparatus has an adapter device for increasing the distance between adjacent contact paths, wherein the adapter device has contact elements for making touching contact with the test contacts.

A known contact-making apparatus of the type mentioned initially has a test head which has a plurality of holding elements arranged at a distance from one another. The holding elements are in the form of guide plates which have guide holes in which test contacts, which are in the form of bent wires, are inserted in a manner such that the wires can be moved longitudinally. The test contacts make touching contact with an adapter device which is used to increase the very narrow contact separation between the test contacts. That separation is predetermined by the contact separation on the unit under test. The increase of contact separation causes adjacent contact paths to be further apart from one another. For this purpose, those ends of the contact elements of the adapter device which are averted from the test head are connected to a printed circuit board. The printed circuit board is connected to an electrical test device, which performs an electrical test of the unit under test by making contact with the test contacts on the test head. This makes it possible, for example, to test wafers to be used in computer technology. Since the contact between the test contacts and the test head and the contact elements on the adapter device is made by pressing them against one another, good contact is present only when oxide layers and contamination are avoided. Copper wires are accordingly used as contact elements for the adapter device, with their contact elements being gold-plated. Despite the gold-plating, environmental influences or maintenance measures can result in the contacts not being optimal.

SUMMARY OF THE INVENTION

The invention is thus has the object of providing a contact-making apparatus of the type mentioned initially, in which good contact is always achieved between the test contacts and the contact elements of the adapter device.

According to the invention, this object is achieved in that the contact elements are comprised or composed of a noble metal or of a noble metal alloy, or of an alloy having at least one noble metal component, or of electrically conductive plastic. The noble metal, the noble metal alloy, the alloy with at least one noble metal component or the electrically conductive plastic is selected such that, in particular, the electrical characteristics are very good, and the formation of oxide layers is preferably prevented, even at high temperatures and/or high air humidity. The noble metal alloy has only noble metals and particularly at least two. The alloy with at least one noble metal component has at least one noble metal component or a plurality of noble metal components, and at least one base metal component or a plurality of base metal components. The base metal component may be a base metal or a substance which is not composed of metal. In comparison to gold plating, the use, according to the invention, of solid noble metal or of a solid noble metal alloy or a solid alloy with at least one noble metal component or a solid electrically conductive plastic mean that problems associated with a coating, such as those which occur, for example, in the case of a gold coating when it is abrasively cleaned in order to improve the contact, cannot occur. In fact, the solid noble metal or noble metal alloy or alloy with at least one noble metal component or plastic embodiment means that a good electrical contact, which always remains the same, is provided even in the event of cleaning. At high temperatures and/or when the air humidity is high, low-impedance touching contacts are always possible, because of the material used according to the invention. The selected noble metal and/or the selected noble metal alloy and/or the selected alloy with at least one noble metal component and/or the selected plastic can be matched to the various temperature ranges of the respective point of use by means of appropriate choice of material. In particular, it is also possible for the test contacts on the test head likewise to be composed or comprised of solid noble metal or a solid noble metal alloy or a solid alloy with at least one noble metal component or a solid electrically conductive plastic, which means that no coating processes are carried out in this case either. In particular, the contact elements and the test contacts may be composed or comprised of the same materials, so that their behaviors are matched to one another.

One development of the invention provides for the noble metal to be silver, gold or palladium. Silver, gold or palladium have excellent electrical characteristics.

It is likewise advantageous for the noble metal alloy to have silver, gold and/or palladium.

One development of the invention provides for the alloy with at least one noble metal component to have silver, gold and/or palladium as the noble metal component.

It is advantageous for the alloy with at least one noble metal component to have copper and/or nickel in addition to the noble metal component. These alloying components lead to very good characteristics in terms of low electrical resistance and a constant resistance over a wide temperature range.

One development of the invention provides for the alloy with at least one noble metal component to be a copper-silver alloy. In this case CuAg is used in particular. Cu denotes copper, and Ag silver.

It is also advantageous for the alloy with at least one noble metal component to be a silver-copper alloy. In particular, AgCu1 to AgCu30, preferably AgCu3 to AgCu20 are used for this purpose. The figures 1, 30, 3 and 20 in the alloys above denote the percentages by weight of the preceding copper. AgCu1 accordingly means that 1% by weight of the alloy is composed of copper, and the rest is composed of silver. The quoted range from AgCu1 to AgCu30 means that these are alloys whose copper component is 1 to 30% with the remainder in each case being silver. Corresponding details can likewise be read in this application.

One development of the invention provides for the alloy with at least one noble metal component to be a silver-carbon alloy, in particular AgC1 to AgC6, preferably AgC3. C denotes carbon. In this case as well, the number after the carbon, which is indicated by C, indicates the percentages by weight (that is to say 1% to 6%, and preferably 3% of carbon, with the remainder in each case being silver).

One development of the invention provides for the alloy with at least one noble metal component to be a gold-nickel alloy. AuNi1 to AuNi10, preferably AuNi5 are preferably used. Au denotes gold, and Ni nickel. The numbers once again indicate percentages by weight, so that AuNi5, for example, means that the alloy contains 5% nickel, with the rest being composed of gold.

It is also advantageous for the noble metal alloy to be a gold-palladium alloy, in particular AgPd10 to AgPd60, preferably AgPd40. Pd denotes palladium, and the numbers once again indicate the percentages by weight.

In particular, the contact elements may be in the form of contact wires, which are composed of solid noble metal, or of a solid noble metal alloy or of a solid alloy with at least one noble metal component, or of solid electrically conductive plastic.

One development of the invention provides for the ends of the contact wires to be located in apertures in the adapter device, or to pass through these apertures. An adapter device such as this is normally also referred to as an "interface" or "connector". The adapter device accordingly has a holding element through which the apertures of the invention pass, with the contact pattern of the apertures corresponding to the contact pattern of the test contacts on the test head. The contact elements are arranged in the apertures in such a way that they have contact surfaces which are opposite the test contacts, which are in the form of test pins or bent wires. In order to attach the contact elements to the holding element, the contact elements, in particular contact wires, are secured in the apertures by encapsulation. If the contact elements are in the form of contact wires, it is possible for them to project out of that side of the adapter device which is averted from the test head and to be connected to a connecting device which may in particular be in the form of a printed circuit board (PCB). In particular, the invention provides for the corresponding ends of the contact wires to be electrically connected to conductor tracks on the printed circuit board. The connecting device is connected to the electrical test device, or is a part of the electrical test device.

One development of the invention provides for the noble metal or the noble metal alloy or the alloy with at least one noble metal component to be a heat-treated noble metal or a heat-treated noble metal alloy or a heat-treated alloy. In consequence, the noble metal is heat-treated, that is, it is subjected to heat treatment. The same applies to the noble metal alloy or the alloy with at least one noble metal component. This has a particularly advantageous influence on the electrical characteristics, in particular the resistance values, of the contact element so that it is preferably possible to provide a connection with as low a resistance as possible, and/or preferably a constant resistance value over a wide temperature range.

The invention preferably provides for the noble metal, the noble metal alloy or the alloy with at least one noble metal component to be a noble metal which has been heat treated for at least 30 minutes, and in particular at least 60 minutes, or a noble metal alloy or alloy which has been heat-treated for at least 30 minutes, in particular 60 minutes. In consequence, the heat-treatment process is carried out on a time-controlled basis, that is, it is heated to the heat-treatment temperature within a specific, predetermined time period which is at least 30 minutes, in particular at least 60 minutes, so that a sufficiently long time interval passes before the desired heat-treatment temperature is reached. Alternatively, the heat-treatment process is carried out at a predetermined heat-treatment temperature in at least 30 minutes, and preferably at least 60 minutes.

It is also advantageous for the noble metal, the noble metal alloy or the alloy with at least one noble metal component to be cooled down to room temperature over a predetermined time period after the heat-treatment process, in particular directly after the heat-treatment process. The time period is, in particular, at least 15 minutes, and preferably at least 30 minutes. In consequence, the heat-treatment process is followed by controlled cooling down, which lasts for a time period of at least 15 minutes, and preferably at least 30 minutes. During this process, it is preferably cooled down to room temperature. This controlled cooling-down process also ensures that the contact element has the electrical characteristics mentioned above.

The invention also relates to a method for production of at least one contact element of a contact-making apparatus for electrical connection of a unit under test to an electrical test device, having a plurality of electrical test contacts, which are associated with at least one holding element, for making contact with the unit under test, and having an adapter device for increasing the distance between adjacent contact paths, with the adapter device having contact elements for making touching contact with the test contacts, with each contact element being manufactured from noble metal or from a noble metal alloy, or from an alloy with at least one noble metal component, or from electrically conductive plastic.

The method according to the invention preferably provides for the noble metal, the noble metal alloy or the alloy with at least one noble metal component to be heat-treated for at least 30 minutes, and preferably for at least 60 minutes.

It is advantageous for the heat treatment to be carried out up to a temperature of 80° C. to 160° C., and preferably up to a temperature of 120° C., or at a temperature of 80° C. to 160° C., and preferably at a temperature of 120° C.

After the heat-treatment process, in particular immediately after the heat treatment process, it is preferably cooled down over a time period of at least 15 minutes, and preferably at least 30 minutes.

Finally, it is advantageous for the cooling down to be carried out down to room temperature, in particular down to a temperature of 15° C. to 25° C., and preferably down to a temperature of 20° C.

Other features and advantages of the present invention will become apparent from the following description of the invention which refers to the accompanying drawings.

DETAILED DESCRIPTION OF A PREFERRED EMBODIMENT OF THE INVENTION

The Figure shows a contact-making apparatus 1 with which contact is made, for example, with a unit under test 3 in the form of a wafer 2, for test purposes. For this purpose the contact-making apparatus 1 is connected to an electrical test device, which is not illustrated but which for example tests correct operation of the unit under test via a large number of contact parts, and signals the unit under test as being defective if any functional faults are found.

Figure 1:
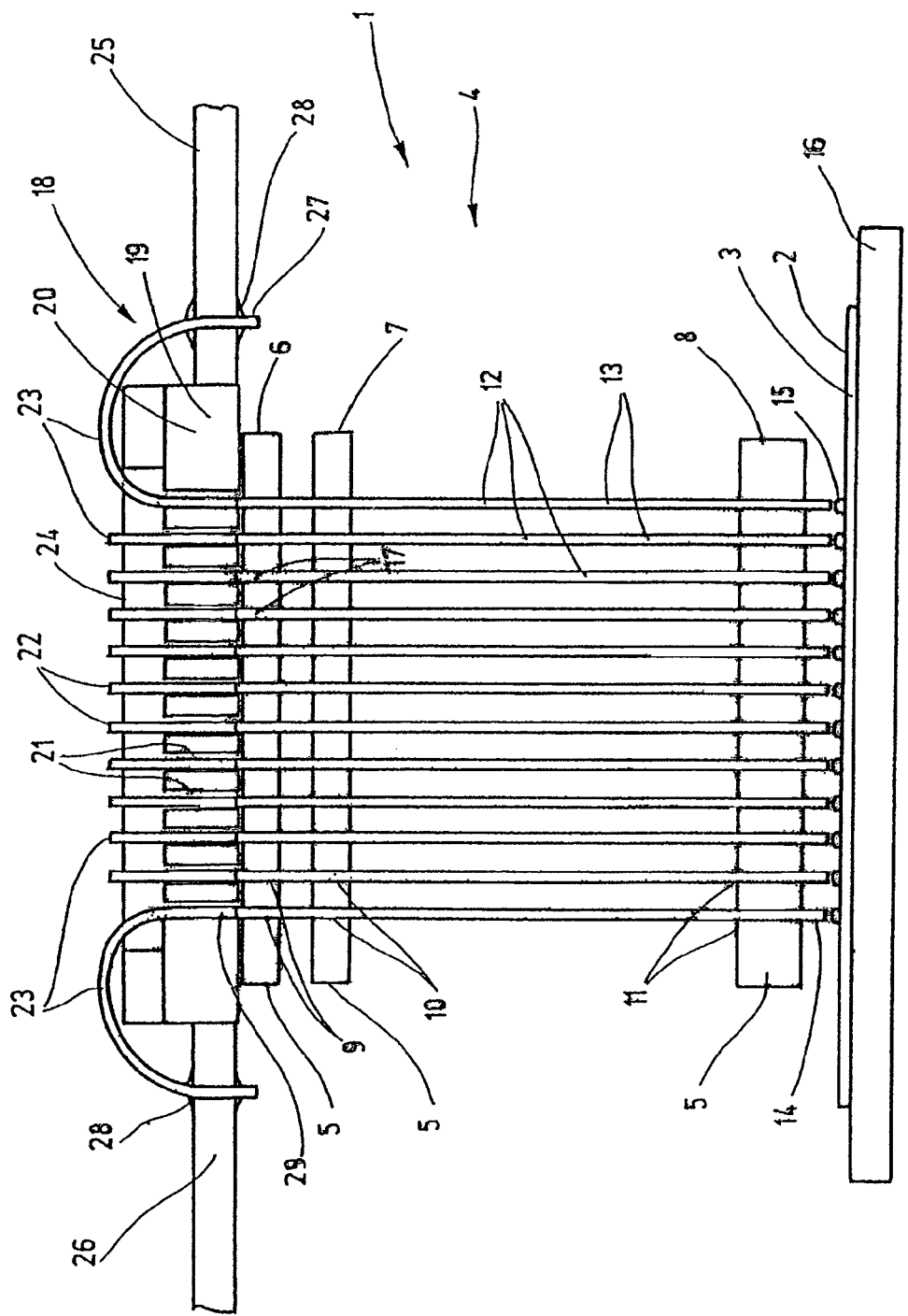
FIG. 1 illustrates the invention on the basis of one exemplary embodiment, which shows a side view of a contact-making apparatus.
Figure 2:
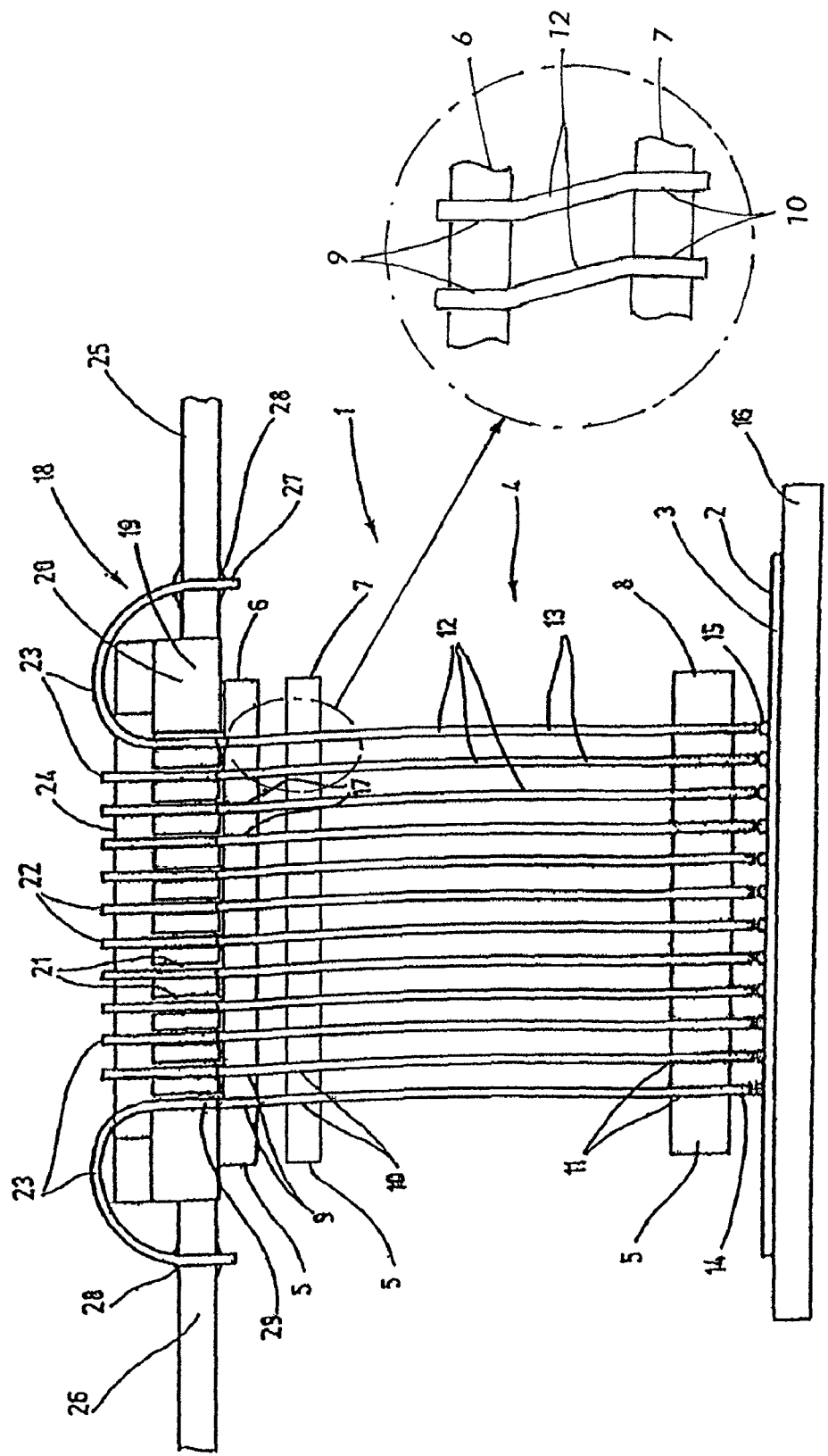
FIG. 2 is based on FIG. 1, except that it shows some of the guide holes as misaligned with respect to the remainder of the guide holes, a portion of the misalignment being shown in a recognizable manner in an enlarged portion of FIG. 2.

The contact-making apparatus 1 has a test head 4 which has a plurality of (for example 3) holding elements 5 which are located parallel to one another and spaced apart vertically, and which are in the form of guide plates 6, 7 and 8. The guide plates 6, 7, 8 extend parallel to one another and have respective guide holes 9, 10 and 11 passing through them, which are from guide plate to guide plate aligned with one another, as shown in FIG. 1, or else they can be slightly laterally offset or misaligned with respect to one another. Test contacts 12 are arranged in respective aligned sets of the guide holes 9 to 11, by preferably being plugged into them, so that the contacts are mounted such that they can move axially. If the guide holes 9 to 11 are not aligned, for example if the guide holes 9 and 11 are aligned but the guide holes 10 are not aligned, as shown in FIG. 2, the test contacts 12, which are in particular in the form of bent wires 13, are deflected slightly laterally so that, on the one hand, they are prevented or inhibited from falling out of the test head 4 while, on the other hand, they are provided with a preferred direction of being bent outward, if they are axially loaded in order to make contact with the unit under test 3.

Those ends 14 of the test contacts 12 which face the unit under test 3 are opposed to the contacts 15 of the unit under test, with the unit under test 3 being located on a base 16, and in particular being supported on the base.

An adapter device 18 is located opposite the opposite ends 17 of the test contacts 12. It has a holding element 19 in the form of a holding plate 20. Apertures 21 pass through the holding plate 20 and are arranged such that they are aligned with the guide holes 9 in the guide plate 6. Contact elements 22 which are in the form of contact wires 23 are located in the apertures 21. In order to secure the contact wires 23 in the apertures 21, they are held axially such that they cannot move, by encapsulation by means of a cured encapsulation compound 24. The contact wires 23 each lead in a curved shape (180° arc) to a connecting device 25, which is in the form of a printed circuit board 26. The ends 27 of the contact wires 23 are soldered to conductor tracks 28 on the printed circuit board 26.

The contact elements 22, which are preferably in the form of contact wires 23, are comprised, but preferably composed, of noble metal. Silver, gold, palladium or platinum is preferably used as the noble metal, resulting in solid elements and wires. According to one alternative solution, a noble metal alloy, which preferably has silver, gold, palladium and/or platinum, is used as the material for the contact elements 22, in particular contact wires 23. A further option is for the contact elements to be composed of an alloy with at least one noble metal component from the noble metals mentioned above, together with at least one further substance which is not a noble metal. In particular, copper, nickel and/or carbon may be used as the further substance. A further alternative solution provides for electrically conductive plastic to be used as the material for the contact elements 22, in particular the contact wires 23.

In order to test the unit under test 3, the contact-making apparatus 1 and the unit under test 3 are moved towards one another so that the ends 14 of the bent wires 13 are placed onto the contacts 15 of the unit under test. Furthermore, the ends 17 of the test contacts 12, in particular bent wires 13, and the correspondingly opposite ends 29 of the contact elements 22, in particular contact wires 23 (which are composed of solid noble metal, or alternatively a solid noble metal alloy, or alternatively a solid alloy with at least one noble metal component, or alternatively a solid electrically conductive plastic) are located opposite one another, so that touching contacts are formed in this case as well. In this way, the unit under test 3 is connected via the test contacts 12 on the test head 4 to the contact elements 22 on the adapter device 18, with the conductor tracks 28, which are connected to the contact elements 22, of the adapter device 18 leading to a test device, which is not illustrated but electrically tests the operation of the unit under test 3, via the individual current paths.

Provision is preferably made for the contact elements 22 to have characteristics which are as good as possible, in order to allow specific applications to be carried out. For one application, by way of example, a very low impedance connection may be required, which exists, however, only in a very narrow temperature range, for example in the region of room temperature. Other applications require the respective contact element 22 to have a resistance value which is as constant as possible over a wide temperature range. This requires a material, in particular an alloy, which has a low temperature coefficient of electrical resistance. The materials mentioned in this application furthermore have only a small tendency to oxidation.

Copper-silver alloys which preferably have a specific conductivity (m/Ωmm2)>40) are particularly suitable for use for low-impedance connections for the contact elements 22. The following alloys are preferred: CuAg, AgC3, AgCu3 to AgCu20. Materials with a nickel component for formation of the contact elements 22, whose temperature coefficient of electrical resistance is $(K-1\cdot 10-4)<4$ are suitable for connections with a resistance value which is as constant as possible over a wide temperature range, for example from −50° C. to +150° C. AuNi5, AgPd40 are particularly suitable.

In order to achieve the electrical characteristics mentioned above, the materials must be heat-treated for at least 60 minutes at 120° C., and must then be cooled down to room temperature over a time period of at least 30 minutes.

The contact elements 22 according to the invention are preferably in the form of drawn wires, which are preferably provided with electrical insulation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A contact-making apparatus configured to electrically connect a unit under test to an electrical test device, the apparatus comprising:

a plurality of electrical test contacts, for making contact with the unit under test, and a plurality of holding elements for holding the test contacts, for positioning the test contacts, and having guide holes which all extend parallel to one another, the guide holes in each holding element being misaligned with respect to the guide holes in at least one other holding element, and an adapter device shaped and operable for increasing the distance between adjacent contact paths of the test contacts, the adapter device having contact elements each positioned for making temporary touching contact with a respective one of the test contacts, a restraint holding each of the contact elements axially such that they cannot move, wherein a connection of the unit under test with the contact elements is established via the test contacts, the contact elements being comprised of noble metal, or of a noble metal alloy, or of an alloy having at least one noble metal component, or of electrically conductive plastic, and the test contacts not being coated with a coating of a noble metal, a noble metal alloy, an alloy having at least one noble metal component, or electrically conductive plastic, the test contacts being comprised of a noble metal, or of a noble metal alloy, or of an alloy having at least one noble metal component, or of electrically conductive plastic, the test contacts being held by the holding elements so as to be axially moveable as a whole relative to the contact elements, the axial movement of the test contacts relative to the contact elements being such that each of the test contacts are brought into temporary touching contact with a respective one of the contact elements, the axial movement of the test contacts relative to the contact elements occurring when the contact-making apparatus and the unit under test are moved towards one another.

2. The contact-making apparatus of claim 1, wherein the noble metal is silver, gold, palladium or platinum.

3. The contact-making apparatus of claim 1, wherein the noble metal alloy includes at least two of the noble metals selected from the group consisting of silver, gold, palladium, platinum.

4. The contact-making apparatus of claim 1, wherein the alloy with at least one noble metal component includes at least one noble metal component selected from the group consisting of silver, gold, palladium and platinum.

5. The contact-making apparatus of claim 4, wherein the alloy with at least one noble metal component includes at least one component selected from the group consisting of copper, nickel and carbon.

6. The contact-making apparatus of claim 1, wherein the alloy with at least one noble metal component includes at least one component selected from the group consisting of copper, nickel and carbon.

7. The contact-making apparatus according to claim 1, wherein the alloy with at least one noble metal component is a copper-silver alloy CuAg.

8. The contact-making apparatus according to claim 1, wherein the alloy with at least one noble metal component is a silver-copper alloy in the range of AgCu1 to AgCu30.

9. The contact-making apparatus according to claim 1, wherein the alloy with at least one noble metal component is a silver-carbon alloy.

10. The contact-making apparatus according to claim 1, wherein the alloy with at least one noble metal component is a silver-carbon alloy in the range of AgC1 to AgC6.

11. The contact-making apparatus of claim 1, wherein the alloy with at least one noble metal component is a gold-nickel alloy.

12. The contact-making apparatus of claim 11, wherein the alloy with at least one noble metal component is a gold-nickel alloy in the range of AuNi1 to AuNi10.

13. The contact-making apparatus of claim 1, wherein the noble metal alloy is a gold-palladium alloy.

14. The contact-making apparatus of claim 13, wherein the noble metal alloy is a gold-palladium alloy in the range of AgPd10 to AgPd60.

15. The contact-making apparatus of claim 1, wherein the contact elements are contact wires.

16. The contact-making apparatus of claim 15, further comprising apertures in the adapter device and the contact wires pass through or are located in the apertures.

17. The contact-making apparatus of claim 16, wherein the contact wires are attached to the adapter device by encapsulation.

18. The contact-making apparatus claim 1, further comprising a printed circuit board having conductor tracks thereon;
the contact elements include contact wires having ends away from the test contacts and the ends and are averted from the test contacts and the ends of the contact wires are electrically connected to the conductor tracks on the printed circuit board.

19. The contact-making apparatus of claim 1, wherein each of the noble metal, or the noble metal alloy, or the alloy with at least one noble metal component has been heat-treated.

20. The contact-making apparatus of claim 19, wherein after having been heat treated, the noble metal, the noble metal alloy or the alloy with at least one noble metal component has been cooled down to room temperature over a time period.

21. A contact-making apparatus configured to electrically connect a unit under test to an electrical test device, the apparatus comprising:
a plurality of electrical test contacts, and a plurality of holding elements for holding the test contacts and positioning the test contacts, for making contact with the unit under test, the holding elements having guide holes which all extend parallel to one another, the guide holes in each holding element being misaligned with respect to the guide holes in at least one other holding element, and
an adapter device shaped and operable for increasing the distance between adjacent contact paths of the test contacts, the adapter device having contact elements each positioned for making temporary touching contact with a respective one of the test contacts, a restraint holding each of the contact elements axially such that they cannot move, wherein a connection of the unit under test with the contact elements is established via the test contacts,
the contact elements being comprised of noble metal or of a noble metal alloy, or of an alloy having at least one noble metal component,
wherein the noble metal alloy includes at least two of the noble metals selected from the group consisting of silver, gold, palladium, and platinum,
wherein the alloy having at least one noble metal component includes at least one noble metal component selected from the group consisting of silver, gold, palladium, and platinum, and includes at least one component selected from the group consisting of nickel and carbon, and
wherein each of the contact elements makes temporary touching contact with a respective one of the test contacts when at least one of the contact-making apparatus and the unit under test is moved such that the distance between the contact-making apparatus and the unit under test is decreased, the test contacts being held by the holding elements so as to be axially moveable as a whole relative to the contact elements.

22. A contact-making apparatus configured to electrically connect a unit under test to an electrical test device, the apparatus comprising:
a plurality of electrical test contacts, and a plurality of holding elements for holding the test contacts and positioning the test contacts, for making contact with the unit under test, the holding elements having guide holes which all extend parallel to one another, the guide holes in each holding element being misaligned with respect to the guide holes in at least one other holding element, and
an adapter device shaped and operable for increasing the distance between adjacent contact paths of the test contacts, the adapter device having contact elements each positioned for making temporary touching contact with a respective one of the test contacts, a restraint holding each of the contact elements axially such that they cannot move, wherein a connection of the unit under test with the contact elements is established via the test contacts, the contact elements being comprised of noble metal or of a noble metal alloy, or of an alloy having at least one noble metal component, wherein the noble metal alloy includes at least two of the noble metals selected from the group consisting of silver, gold, palladium, and platinum, wherein the alloy having at least one noble metal component includes at least one noble metal component selected from the group consisting of silver, gold, palladium, and platinum, and includes at least one component selected from the group consisting of nickel and carbon, wherein each of the noble metal, or the noble metal alloy, or the alloy having at least one noble metal component has been heat-treated, and wherein each of the contact elements makes temporary touching contact with a respective one of the test contacts when at least one of the contact-making apparatus and the unit under test is moved such that the distance between the contact-making apparatus and the unit under test is decreased, the test contacts being held by the holding elements so as to be axially moveable as a whole relative to the contact elements.

* * * * *